United States Patent
Matsumoto et al.

(10) Patent No.: US 9,991,883 B2
(45) Date of Patent: Jun. 5, 2018

(54) STATIC SWITCH

(71) Applicant: TOSHIBA MITSUBISHI-ELECTRIC INDUSTRIAL SYSTEMS CORPORATION, Chuo-ku (JP)

(72) Inventors: Yasuaki Matsumoto, Chuo-ku (JP); Akinobu Ando, Chuo-ku (JP); Yasuhiko Hosokawa, Chuo-ku (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 0 days. days.

(21) Appl. No.: 15/540,124

(22) PCT Filed: Jan. 7, 2015

(86) PCT No.: PCT/JP2015/050259
§ 371 (c)(1),
(2) Date: Jun. 27, 2017

(87) PCT Pub. No.: WO2016/110958
PCT Pub. Date: Jul. 14, 2016

(65) Prior Publication Data
US 2017/0353179 A1    Dec. 7, 2017

(51) Int. Cl.
*H03K 17/13* (2006.01)
*H03K 17/04* (2006.01)
(Continued)

(52) U.S. Cl.
CPC ............ *H03K 17/136* (2013.01); *H02M 1/32* (2013.01); *H03K 17/0403* (2013.01);
(Continued)

(58) Field of Classification Search
CPC ........ H02M 1/08; H02M 1/083; H02M 1/088; H02M 3/158; H02M 1/32;
(Continued)

(56) References Cited

U.S. PATENT DOCUMENTS 4,445,183 A * 4/1984 McCollum ........... H02H 3/0935
361/13
4,586,121 A * 4/1986 Gilliam ............... H02M 1/0845
363/129
(Continued)

FOREIGN PATENT DOCUMENTS

JP    55-103073 A    8/1980

OTHER PUBLICATIONS

International Search Report dated Apr. 14, 2015, in PCT/JP2015/050259 filed Jan. 7, 2015.

*Primary Examiner* — Gustavo Rosario Benitez
(74) *Attorney, Agent, or Firm* — Oblon, McClelland, Maier & Neustadt, L.L.P.

(57) ABSTRACT

A thyristor switch is constituted of a pair of arms connected in anti-parallel, each of the arms including a plurality of thyristors connected in series. A controller includes a phase detecting unit configured to detect a phase of a power supply voltage supplied from an alternating-current power supply, and a gate signal generating unit configured to interrupt a gate signal when an open command is provided to the static switch and the phase of the power supply voltage detected by the phase detecting unit matches a target phase. The target phase is set outside of a phase range where interruption of the gate signal is prohibited, the phase range being set so as to include a zero crossing point at which a load current is switched in polarity.

4 Claims, 7 Drawing Sheets

(51) Int. Cl.
    *H02M 1/32*     (2007.01)
    *H04Q 3/52*     (2006.01)
    *H03K 17/66*     (2006.01)
    *H02M 1/088*     (2006.01)
    *H02M 5/25*     (2006.01)

(52) U.S. Cl.
    CPC ............... *H03K 17/66* (2013.01); *H04Q 3/52* (2013.01); *H02M 1/088* (2013.01); *H02M 5/25* (2013.01)

(58) Field of Classification Search
    CPC ........... H02M 2001/0058; H02M 5/25; H02M 5/2573; H03K 17/725; H03K 17/0403; H03K 17/66; H03K 17/10; H03K 17/12; H03K 17/13; H03K 17/136; H03K 17/125; H03K 17/105; H03K 17/305
    See application file for complete search history.

(56) References Cited

U.S. PATENT DOCUMENTS

| | | | | |
|---|---|---|---|---|
| 5,239,252 | A * | 8/1993 | Runggaldier | ........... H02P 27/02 318/806 |
| 2006/0098467 | A1 * | 5/2006 | Shlaimoun | .......... H02M 5/2573 363/135 |
| 2012/0200165 | A1 * | 8/2012 | Kansala | ................ H02M 1/088 307/99 |
| 2013/0070499 | A1 * | 3/2013 | Mohajerani | ......... H02M 7/4807 363/126 |
| 2015/0309108 | A1 * | 10/2015 | Geske | .................. G01R 31/263 324/750.01 |

* cited by examiner

STATIC SWITCH

TECHNICAL FIELD

The present invention relates to a static switch, and more particularly to a static switch using a thyristor switch.

BACKGROUND ART

Consideration has been given to the use of a static switch as a switch for switching between electrical connection and disconnection between an alternating-current power supply and a load. For a static switch, a thyristor switch is typically used that is constituted of a pair of thyristors connected in anti-parallel.

For example, Japanese Patent Laying-Open No. 55-103073 (PTD 1) discloses a thyristor switch that has anti-parallel connected thyristor arms, each constituted of a plurality of thyristors connected in series, and that is configured to supply alternating power to a load through the pair of thyristor arms connected in anti-parallel. In PTD 1, in response to a gate signal applied to the thyristor arms, the plurality of thyristors are turned on and a load current is allowed to flow. Thus, the load is supplied with alternating power. In this state, in response to interruption of the gate signal, the plurality of thyristors are turned off and the load current comes to zero. Thus, the power supply to the load is interrupted.

CITATION LIST

Patent Document

PTD 1: Japanese Patent Laying-Open No. 55-103073

SUMMARY OF INVENTION

Technical Problem

However, in the above-described thyristor switch, due to variations in element characteristics among the plurality of thyristors constituting each thyristor arm, one thyristor arm may include a mixture of thyristors that have been turned off and thyristors that remain in an on-state, depending on the timing of interruption of the gate signal. In such a case, thyristors that remain in an on-state may be subject to unwanted stress. The stress may accelerate the deterioration of the thyristors. Also, an increase of the stress may lead to element breakdown of the thyristors. This results in a problem of reduction in life of the thyristor switch.

The present invention has been made to solve the above-described problems. An object of the present invention is to prevent unwanted stress from being applied to a plurality of thyristors constituting a thyristor switch in a static switch.

Solution to Problem

A static switch according to the present invention is a static switch for switching between electrical connection and disconnection between an alternating-current power supply and a load. The static switch includes: a thyristor switch connected between the alternating-current power supply and the load and constituted of a pair of arms connected in anti-parallel, each of the arms including a plurality of thyristors connected in series; and a controller configured to perform on-off control of the thyristor switch. The thyristor switch is configured to be turned on in response to a gate signal supplied from the controller, and turned off in response to a current coming to zero in a state in which the gate signal is interrupted. The controller includes a phase detecting unit configured to detect a phase of a power supply voltage supplied from the alternating-current power supply, and a gate signal generating unit configured to interrupt the gate signal when an open command is provided to the static switch and the phase of the power supply voltage detected by the phase detecting unit matches a target phase. The target phase is set outside of a phase range where interruption of the gate signal is prohibited, the phase range being set so as to include a zero crossing point at which a load current is switched in polarity.

Advantageous Effects of Invention

According to the present invention, in a static switch, a plurality of thyristors constituting a thyristor switch can be turned off at the same timing. This can prevent unwanted stress from being applied to the plurality of thyristors. As a result, the life of the thyristor switch can be prolonged.

DESCRIPTION OF EMBODIMENTS

An embodiment of the present invention is described below in detail with reference to the drawings. In the following, identical or equivalent portions are denoted with identical reference signs in the drawings, and explanations for the portions are not repeated in principle.

Figure 1:
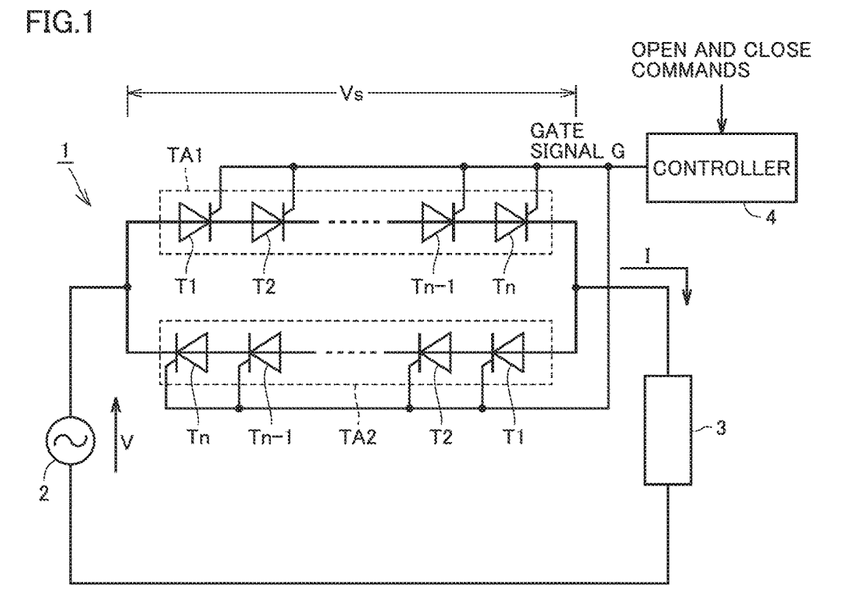
FIG. 1 is a circuit configuration diagram of a static switch according to an embodiment of the present invention.

FIG. 1 is a circuit configuration diagram of a static switch according to an embodiment of the present invention. With reference to FIG. 1, the static switch is a switch for switching between electrical connection and disconnection between an alternating-current power supply 2 and a load 3. The static switch includes a thyristor switch 1 and a controller 4.

Thyristor switch 1 is connected between alternating-current power supply 2 and load 3. In FIG. 1, a power supply voltage of alternating-current power supply 2 is denoted by V, an inter-terminal voltage of thyristor switch 1 is denoted by Vs, and a current (load current) supplied through thyristor switch 1 to load 3 is denoted by I. In the following description, in order to facilitate understanding of an operation of thyristor switch 1, load 3 is assumed to be an inductive load.

Thyristor switch 1 includes a pair of thyristor arms TA1, TA2 connected in anti-parallel. Each of thyristor arms TA1, TA2 is constituted of a plurality of thyristors T1-Tn (where n is an integer of two or more) connected in series. Thyristors T1-Tn are turned on in response to a gate signal G input (switched on) from controller 4. On-state thyristors T1-Tn are turned off in response to the current coming to zero in a state in which gate signal G is interrupted (switched off). In the following, thyristor arms TA1, TA2 are also simply referred to as "thyristor arm TA" when they are expressed comprehensively, and thyristors T1-Tn are also simply referred to as "thyristor T" when they are expressed comprehensively.

Controller 4 performs on-off control of thyristor switch 1. Controller 4 is implemented mainly by, for example, a central processing unit (CPU), a memory, and an interface circuit. In response to open and close commands supplied from a high-order control unit (not shown), controller 4 generates gate signal G to be supplied to thyristor switch 1. A control structure of controller 4 will be described later.

Figure 2:
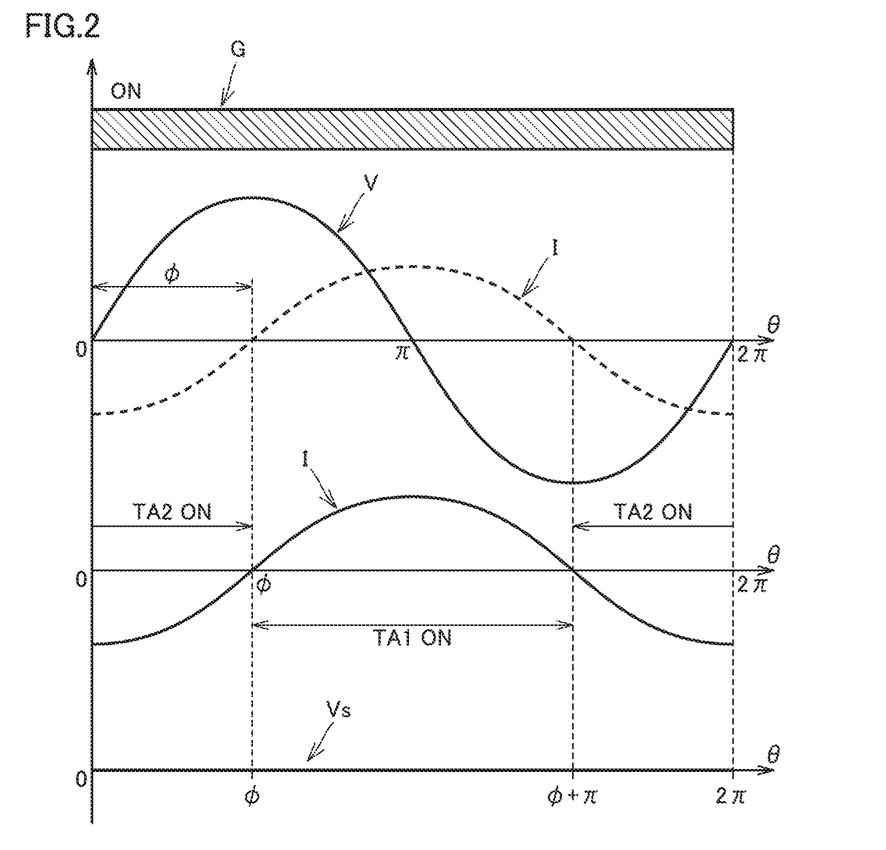
FIG. 2 is a waveform diagram for explaining an operation of a thyristor switch when a gate signal is in an on-state.

FIG. 2 is a waveform diagram for explaining an operation of thyristor switch 1 when gate signal G is in an on-state.

With reference to FIG. 2, load current I is delayed in phase by a power factor angle $\phi$ of load with respect to power supply voltage V. During negative half cycles in the sinusoidal waveform of load current I, thyristor arm TA2 of thyristor switch 1 is ON. On the other hand, during positive half cycles in the sinusoidal waveform, thyristor arm TA1 is ON. Thus, while gate signal G is being supplied, thyristor arm TA1 and thyristor arm TA2 are alternately comes into an on-state every half cycle in accordance with the polarity of load current I. Accordingly, inter-terminal voltage Vs of thyristor switch 1 presents substantially zero.

Figure 3:
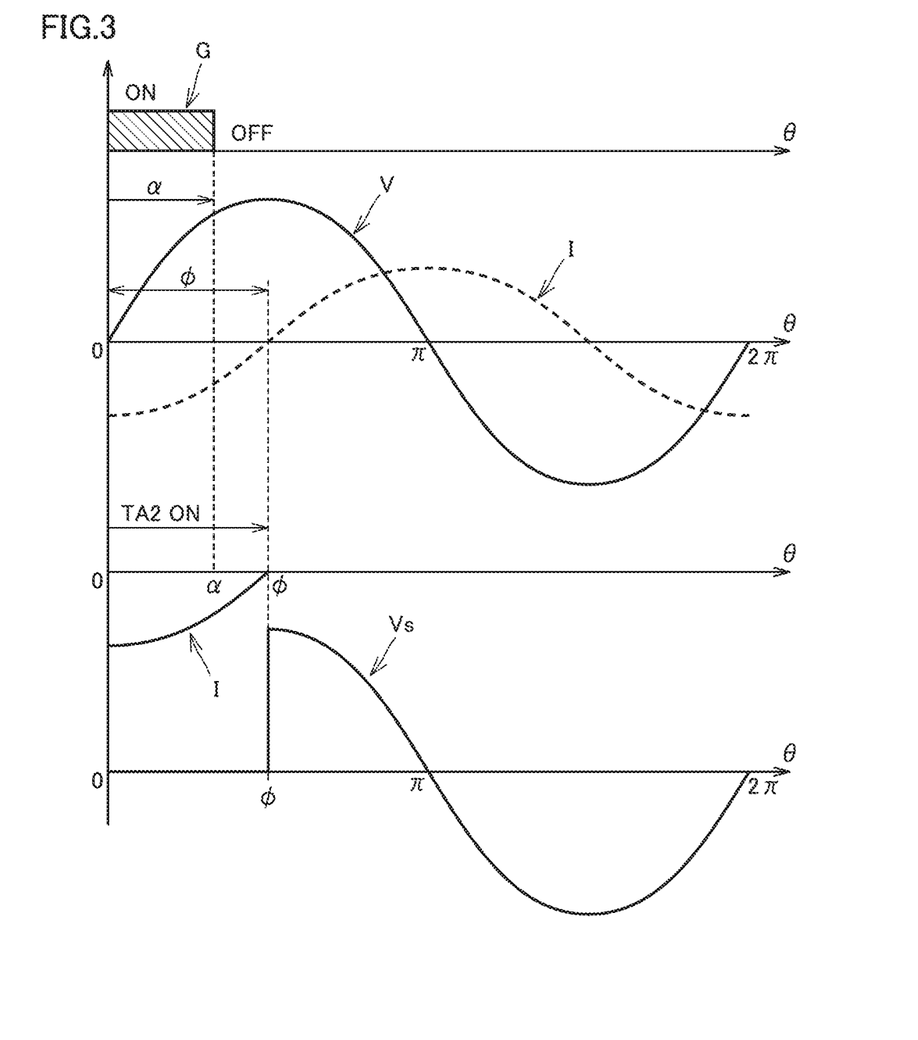
FIG. 3 is a waveform diagram for explaining one mode of an operation of a thyristor switch when a gate signal is switched off.

FIG. 3 is a waveform diagram for explaining one mode of an operation of thyristor switch 1 when gate signal G is switched off in order to open thyristor switch 1. FIG. 3 shows an operation of thyristor switch 1 in the case where gate signal G is switched off at a point in time at which a phase $\theta$ of power supply voltage V is delayed from a point of zero by phase $\alpha$ during a positive half cycle of power supply voltage V.

With reference to FIG. 3, in the case where phase $\alpha$ is smaller than power factor angle $\phi$ ($0<\alpha<\phi$), load current I is negative in polarity and thyristor arm TA2 remains ON at a point in time at which gate signal G is switched off. Then, when load current I reaches a zero point, thyristor arm TA2 is turned off. At this time, thyristor arm TA1, to which gate signal G is not supplied, is not turned on. As a result, thyristor switch 1 comes into an open state. At the timing when thyristor switch 1 comes into the open state, power supply voltage V is applied in a positive direction between the terminals of thyristor switch 1.

As described below, however, thyristor T of thyristor switch 1 may be subject to unwanted stress depending on phase $\alpha$ at which gate signal G is switched off.

Figure 4:
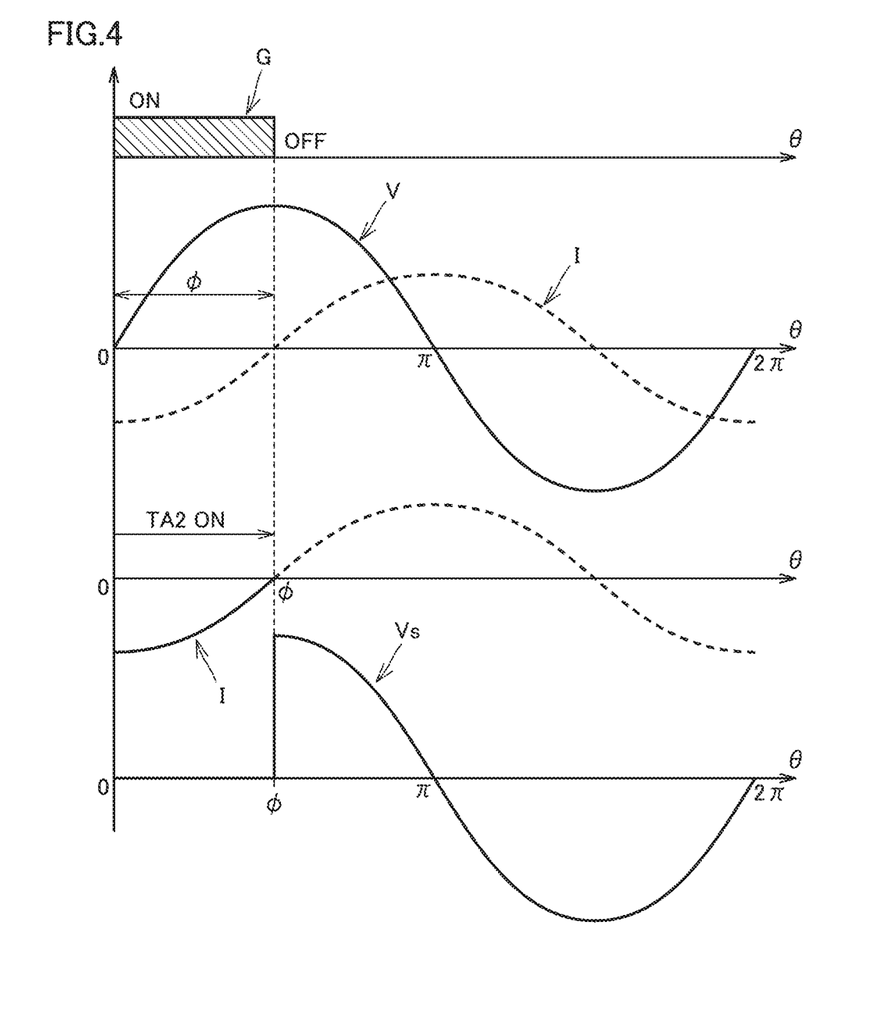
FIG. 4 is a waveform diagram for explaining another mode of an operation of a thyristor switch when a gate signal is switched off.

FIG. 4 is a waveform diagram for explaining another mode of an operation of thyristor switch 1 when gate signal G is switched off. FIG. 4 shows an operation of thyristor switch 1 in the case where gate signal G is switched off at a zero crossing point at which load current I is switched in polarity (in the case where phase $\alpha$ is equal to power factor angle $\phi$).

With reference to FIG. 4, thyristor arm TA2 is turned off at a zero crossing point of load current I. Since gate signal G is switched off at a zero crossing point, thyristor arm TA1 is not turned on. As a result, thyristor switch 1 comes into an open state and power supply voltage V is applied in the positive direction between the terminals of thyristor switch 1.

Now consideration is given to an operation of thyristor switch 1 in the case where gate signal G is switched off immediately after a zero crossing point of load current I.

As shown in FIG. 2, in the case where gate signal G is ON, thyristor arm TA2 is turned off and thyristor arm TA1 is turned on at a zero crossing point of load current I. On the other hand, in the case where gate signal G is switched off prior to a zero crossing point of load current I (see FIG. 3) or where gate signal G is switched off at a zero crossing point of load current I (see FIG. 4), that is, in the case where phase $\alpha$ is smaller than or equal to power factor angle $\phi$, thyristor arm TA1 is not turned on at a zero crossing point of load current I.

However, in the case where gate signal G is switched off slightly after a zero crossing point of load current I, that is, in the case where phase $\alpha$ is slightly larger than power factor angle $\phi$ ($\alpha=\phi+\varepsilon$), thyristor arm TA1 is turned on at a zero crossing point of load current I. Accordingly, gate signal G is switched off immediately after load current I starts to flow through thyristor arm TA1. In such a case, two problems described below may arise.

Firstly, a non-uniform state may occur among a plurality of thyristors T1-Tn constituting thyristor arm TA1 due to differences in element characteristics. The non-uniform state is a state where some thyristors are turned on and the other thyristors remain in an off-state without being turned on during a short period of time ($\phi<\theta<\alpha$) from a zero crossing point of load current I to a point at which gate signal G is supplied. If such a non-uniform state occurs in thyristors T1-Tn connected in series due to variations in timing of turn-on, inter-terminal voltage Vs of thyristor switch 1 is intensively applied to some off-state thyristors. Since inter-terminal voltage Vs is equal to power supply voltage V, an overvoltage may be applied to the off-state thyristors depending on power supply voltage V in the case where alternating-current power supply 2 is a high-voltage system.

Secondly, once thyristors are supplied with gate signal G and turned on, a load current flows through the thyristors. After gate signal G is switched off, thyristors that have a load current larger than or equal to a latching current still remain ON until the next zero crossing point. On the other hand, thyristors that have a load current smaller than a latching current are turned off at a point in time at which gate signal G is switched off. Since the latching current is caused by element variations, it takes time for some on-state thyristors to be turned off after gate signal G is switched off. As a result, switching losses generated in these thyristors are increased, causing stress on these thyristors.

In this way, in the case where gate signal G is switched off immediately after a zero crossing point of load current I, thyristors T constituting thyristor arm TA may be subject to unwanted stress. As measures to prevent such problems, a static switch according to this embodiment performs an open phase control of thyristor switch 1, where phase $\alpha$ at which thyristor arm TA is turned off is controlled in opening thyristor switch 1.

The open phase control of the thyristor switch according to this embodiment is described below.

Figure 5:
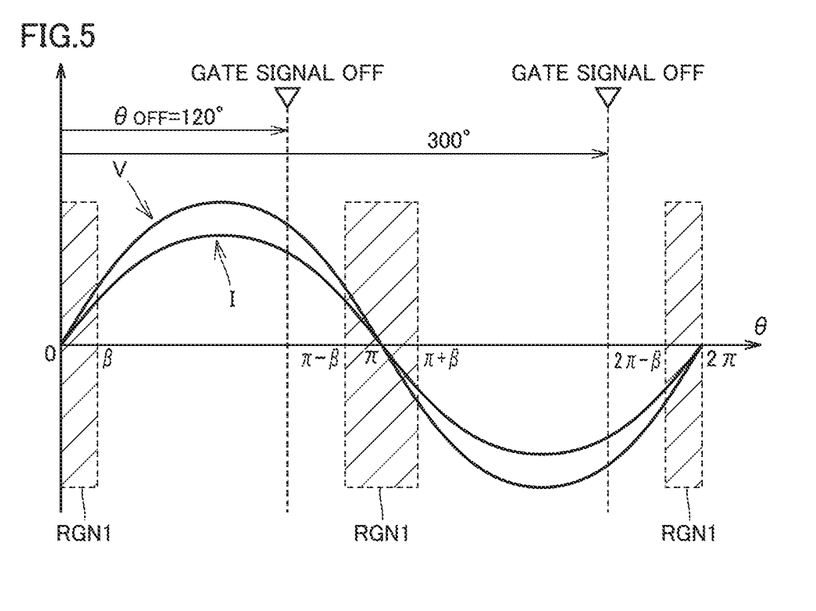
FIG. 5 is a diagram for explaining the concept of an open phase control of a thyristor switch according to an embodiment of the present invention.
Figure 6:
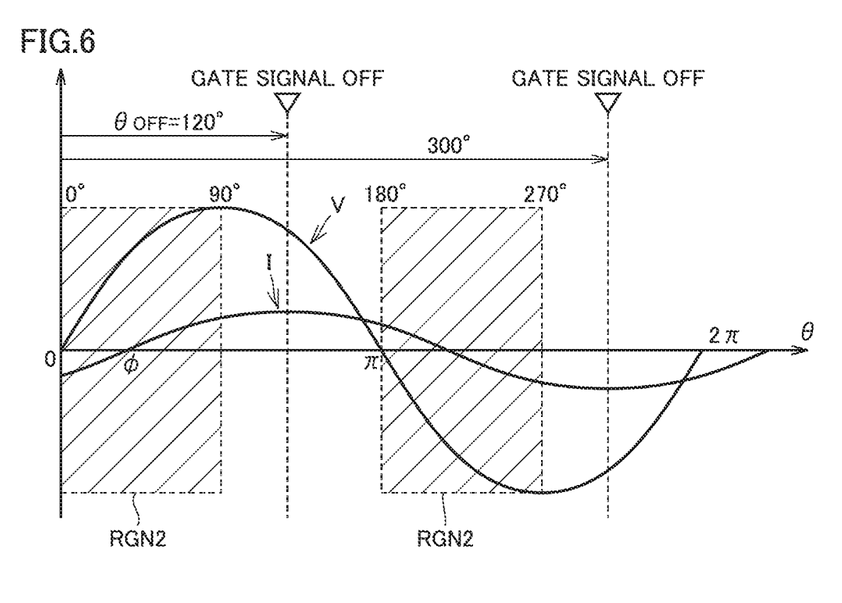
FIG. 6 is a diagram for explaining the concept of an open phase control of a thyristor switch according to an embodiment of the present invention.

FIGS. 5 and 6 are diagrams for explaining the concept of the open phase control of thyristor switch 1 according to this embodiment.

FIG. 5 shows waveforms of power supply voltage V and load current I in the case where load 3 is a purely resistive load. As shown in FIG. 5, since $\phi=0$ (where $\phi$ is a power factor angle of load), the zero crossing points of load current I are at $\theta=0$, 180°, and 360°.

In this embodiment, a range of phase where switch-off of gate signal G is prohibited is set within a phase range that includes a zero crossing point and phases near the zero crossing point of load current I. In the following description, a phase range is also referred to as a "gate-off prohibition zone". In FIG. 5, the phase ranges of $0 \leq \theta \leq \beta$, $180°-\beta \leq \theta \leq 180°+\beta$, and $360°-\beta \leq \theta \leq 360°$ (corresponding to ranges RGN1 in FIG. 5) are set as gate-off prohibition zones.

An upper limit and a lower limit of each gate-off prohibition zone (corresponding to phase $\beta$ in FIG. 5) are preferably set so as to satisfy the condition that all of a plurality of thyristors T1-Tn constituting thyristor arm TA have a conduction current larger than or equal to a holding current. In this case, all of thyristors T1-Tn are in an on-state at phases outside of gate-off prohibition zones. Therefore, whichever phase outside gate-off prohibition zones the gate signal G is switched off at, an overvoltage can be prevented from being applied to some of thyristors T1-Tn.

FIG. 6 shows waveforms of power supply voltage V and load current I in the case where load 3 is an inductive load. As shown in FIG. 6, the zero crossing points of load current I are at $\theta=\phi$ (power factor angle) and $180°+\phi$.

When power factor angle $\phi$ of load is in the range of 0°-90°, a zero crossing point of load current I appears within the range. Accordingly, in FIG. 6, phase ranges of $0 \leq \theta \leq 90°$ and $180° \leq \theta \leq 270°$ (corresponding to ranges RGN2 in FIG. 6) are set as gate-off prohibition zones, as an example. As in the case of FIG. 5 (where power factor angle $\phi$ is zero), an upper limit and a lower limit of each gate-off prohibition zone are preferably set so as to satisfy the condition that all of a plurality of thyristors T1-Tn constituting thyristor arm TA have a conduction current larger than or equal to a holding current.

When a gate-off prohibition zone is set in accordance with power factor angle $\phi$ of load in this way, a target phase (hereinafter also referred to as a "gate-off phase") $\theta_{OFF}$ at which gate signal G is to be switched off is set outside of the set gate-off prohibition zone. In this embodiment, a phase that is not included in either of a gate-off prohibition zone in the case where load 3 is a purely resistive load (see FIG. 5) or a gate-off prohibition zone in the case where load 3 is an inductive load (see FIG. 6) is set as gate-off phase $\theta_{OFF}$. FIGS. 5 and 6 show a case where gate-off phase $\theta_{OFF}$ is set to 120° and 300° ($=180°+120°$).

Figure 7:
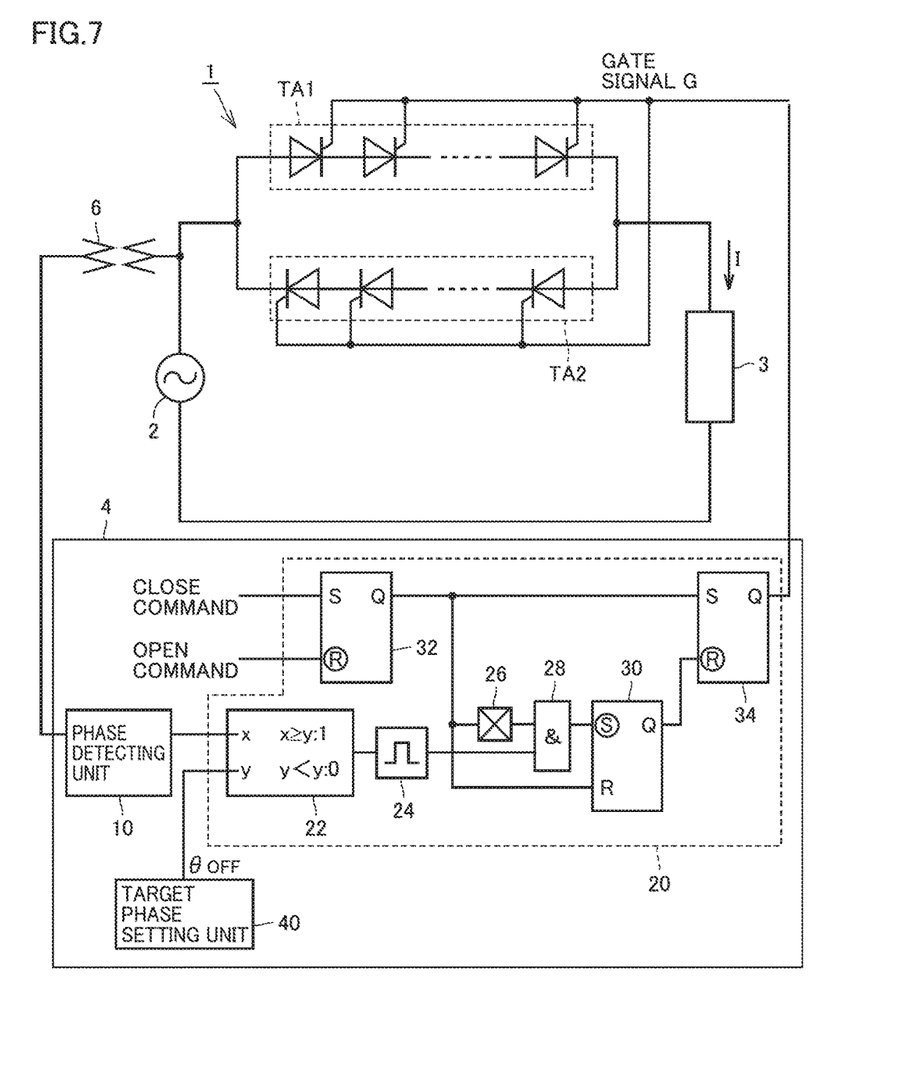
FIG. 7 is a functional block diagram showing a control structure of a controller in a static switch according to an embodiment of the present invention.

FIG. 7 is a functional block diagram showing a control structure of controller 4 in the static switch according to this embodiment.

With reference to FIG. 7, controller 4 includes a phase detecting unit 10, a gate signal generating unit 20, and a target phase setting unit 40.

A voltage detector 6 detects a voltage (power supply voltage) V of alternating-current power supply 2. Power supply voltage V detected by voltage detector 6 is supplied to phase detecting unit 10 in controller 4. Phase detecting unit 10 detects phase $\theta$ of power supply voltage V detected by voltage detector 6.

Target phase setting unit 40 sets gate-off phase $\theta_{OFF}$ based on power factor angle $\phi$ of load that is externally input. Specifically, target phase setting unit 40 sets a gate-off prohibition zone based on power factor angle $\phi$ of load and then sets gate-off phase $\theta_{OFF}$ outside of the set gate-off prohibition zone (see FIGS. 5 and 6). Target phase setting unit 40 outputs the set gate-off phase $\theta_{OFF}$ to gate signal generating unit 20.

In the example configuration of FIG. 7, phase detecting unit 10 resets phase $\theta$ of power supply voltage V for each zero crossing point of the sinusoidal wave to treat the phase $\theta$ as the range of 0°-180°, based on the symmetry of positive and negative of power supply voltage V. Also, with an assumption that power factor angle $\phi$ of load 3 is in the range of 0°-90°, target phase setting unit 40 sets gate-off phase $\theta_{OFF}$ to 120°.

Gate signal generating unit 20 compares phase $\theta$ of power supply voltage V detected by phase detecting unit 10 and gate-off phase $\theta_{OFF}$ set by target phase setting unit 40 with each other. Gate signal generating unit 20 then generates gate signal G based on the comparison results.

Specifically, gate signal generating unit 20 includes a comparing unit 22, a one-shot pulse generating unit 24, a NOT circuit 26, an AND circuit 28, and RS flip-flop circuits 30, 32, 34.

Comparing unit 22 compares phase $\theta$ of power supply voltage V and gate-off phase $\theta_{OFF}$ (=120° with each other. If phase $\theta$ is larger than or equal to gate-off phase $\theta_{OFF}$, comparing unit 22 sets an output signal to activation level "1". On the other hand, if phase $\theta$ is smaller than gate-off phase $\theta_{OFF}$, comparing unit 22 sets an output signal to inactivation level "0".

An output signal of comparing unit 22 is input to one-shot pulse generating unit 24. One-shot pulse generating unit 24 generates a one-shot pulse signal having a predetermined pulse width in response to a rise of an output signal of comparing unit 22. The generated pulse signal is input to one input of AND circuit 28.

RS flip-flop circuit 32 is a reset dominant RS flip-flop circuit. RS flip-flop circuit 32 receives an open command of thyristor switch 1 from a high-order control unit (not shown). Specifically, RS flip-flop circuit 32 receives a close command of thyristor switch 1 with a set terminal S, and receives an open command of thyristor switch 1 with a reset terminal R. When the close command is at the H (logical high) level in activation level, RS flip-flop circuit 32 outputs an H level signal from an output terminal Q. When the open command is at the H level in activation level, RS flip-flop circuit 32 outputs an L (logical low) level signal from output terminal Q. Since RS flip-flop circuit 32 is of a reset dominant type, it outputs an L level signal from output terminal Q when the close command and the open command are both at the H level. Output of RS flip-flop circuit 32 is input to NOT circuit 26 and to a set terminal S of RS flip-flop circuit 34.

NOT circuit 26 inverts an output signal of RS flip-flop circuit 32. Output of NOT circuit 26 is input to the other input of AND circuit 28.

AND circuit 28 calculates a logical AND of a pulse signal and an output signal of NOT circuit 26 (inversion signal of output of RS flip-flop circuit 32). When the close command is at the H level, AND circuit 28 outputs an L level signal. On the other hand, when the open command is at the H level, AND circuit 28 outputs an H level signal during a period in which the pulse signal is at the H level, and outputs an L level signal during a period in which the pulse signal is at the L level. A period in which output of AND circuit 28 is at the H level corresponds to the pulse width of a pulse signal output from one-shot pulse generating unit 24.

RS flip-flop circuit 30 is a set dominant RS flip-flop circuit. RS flip-flop circuit 30 receives output of AND circuit 28 with a set terminal S. and receives output of RS flip-flop circuit 32 with a reset terminal R. RS flip-flop circuit 30 outputs an H level signal from an output terminal Q when output of AND circuit 28 is at the H level. That is, when the open command is at the H level and the pulse signal is at the H level, RS flip-flop circuit 30 outputs an H level signal from output terminal Q. Also, RS flip-flop circuit 30 outputs an L level signal from output terminal Q when output of RS flip-flop circuit 32 is at the H level. That is, when the close command is at the H level, RS flip-flop circuit 30 outputs an L level signal from output terminal Q. Since RS flip-flop circuit 30 is of a set dominant type, it outputs an H level signal from output terminal Q when output of AND circuit 28 and output of RS flip-flop circuit 32 are both at the H level. In other words, when the open command is at the H level, RS flip-flop circuit 30 outputs an H level signal within a range of time corresponding to the pulse width of a pulse signal starting from a point in time at which phase θ of power supply voltage V reaches gate-off phase $θ_{OFF}$.

RS flip-flop circuit 34 is a reset dominant RS flip-flop circuit. RS flip-flop circuit 34 receives output of RS flip-flop circuit 32 with a set terminal S, and receives output of RS flip-flop circuit 30 with a reset terminal R. RS flip-flop circuit 34 outputs an H level signal from an output terminal Q when output of RS flip-flop circuit 32 is at the H level. That is, RS flip-flop circuit 34 outputs an H level signal from output terminal Q when the close command is at the H level. Also, RS flip-flop circuit 34 outputs an L level signal from output terminal Q when output of RS flip-flop circuit 30 is at the H level. That is, when the open command is at the H level and the pulse signal is at the H level, RS flip-flop circuit 34 outputs an L level signal from output terminal Q. Since RS flip-flop circuit 34 is of a reset dominant type, it outputs an L level signal from output terminal Q when output of RS flip-flop circuit 32 and output of RS flip-flop circuit 30 are both at the H level. Output of RS flip-flop circuit 34 is supplied to thyristor arms TA1, TA2 of thyristor switch 1 as gate signal G.

In summary, when the close command is at the H level, gate signal generating unit 20 outputs H level gate signal G. On the other hand, when the open command is at the H level and the pulse signal is at the H level, gate signal generating unit 20 outputs L level gate signal G. In other words, when the open command is at the H level, gate signal generating unit 20 outputs L level gate signal G within a range of time corresponding to the pulse width of a pulse signal starting from a point in time at which phase θ of power supply voltage V reaches gate-off phase $θ_{OFF}$.

In thyristor switch 1, gate signal G is input to thyristor arms TA1, TA2 in response to H level gate signal G, and gate signal G is switched off in response to L level gate signal G.

Figure 8:
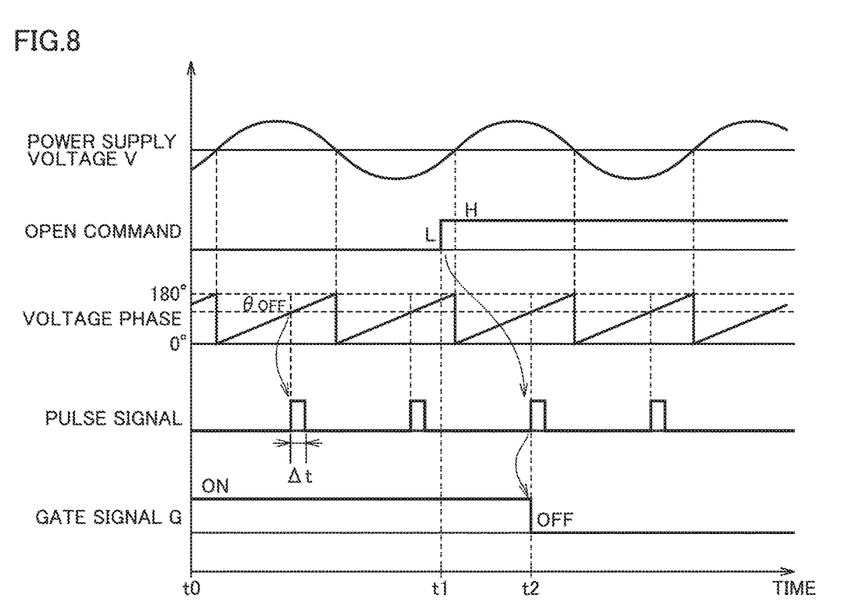
FIG. 8 is a timing chart explaining an open phase control of a thyristor switch according to an embodiment of the present invention.

FIG. 8 is a timing chart explaining an open phase control of thyristor switch 1 according to this embodiment.

With reference to FIG. 8, gate signal G presents the H level on and after time t0. Accordingly, gate signal G is supplied to each of thyristor arms TA1, TA2 of thyristor switch 1.

In controller 4, phase θ of power supply voltage V detected by phase detecting unit 10 and gate-off phase $θ_{OFF}$ (e.g. 120°) are always compared with each other by comparing unit 22. When phase θ of power supply voltage V reaches gate-off phase $θ_{OFF}$ during each positive half cycle and each negative half cycle of power supply voltage V according to the comparison results at comparing unit 22, one-shot pulse generating unit 24 generates a one-shot pulse signal having a predetermined pulse width Δt.

Here, lets assume that an open command activated at the H level is supplied to controller 4 from a high-order control unit at time t1. In controller 4, in response to the H level open command, gate signal generating unit 20 executes the control process shown in FIG. 7 using the H level open command and a pulse signal, thereby generating gate signal G. Gate signal G transitions from the H level to the L level in response to a rise of a pulse signal at time t2 after time t1, as shown in FIG. 8. The transition of gate signal G to the L level causes gate signal G that has been supplied to thyristor arms TA1, TA2 of thyristor switch 1 to be switched off.

The switch-off of gate signal G at time t2 causes one of the thyristor arms TA1, TA2 that is in an on-state to be turned off at a zero crossing point of load current I after time t2. On the other hand, the other of the thyristor arms TA1, TA2 that is in an off-state is not turned on at the zero crossing point of load current I. As a result, thyristor switch 1 comes into an open state.

Thus, the static switch according to this embodiment sets gate-off phase $θ_{OFF}$ outside of a gate-off prohibition zone that includes a zero crossing point and phases near the zero crossing point of load current I. This can prevent unwanted stress from being applied to thyristor T constituting thyristor arm TA when gate signal G is switched off in response to an open command of thyristor switch 1. As a result, a failure of thyristor switch 1 can be avoided and the life of the static switch can be prolonged.

In the above embodiment, a case is described as an example where target phase setting unit 40 is provided in controller 4 to set gate-off phase $θ_{OFF}$ (target phase) of thyristor switch 1. Instead of target phase setting unit 40, however, an input unit may be provided to receive input of gate-off phase $θ_{OFF}$ from a component external to the static switch. Power factor angle ϕ of load is uniquely determined based on the operation conditions of a system in which the static switch according to the present invention is used. Therefore, a user of the system can set gate-off phase $θ_{OFF}$ based on power factor angle ϕ and input it to controller 4.

It should be considered that the embodiment described herein is not limitative but illustrative in all respects. It is intended that the scope of the present invention is defined not by the above description but by the claims and includes all the modifications within the meaning and scope of equivalents of the claims.

REFERENCE SIGNS LIST

1: thyristor switch; 2: alternating-current power supply; 3: load; 4: controller; 10: phase detecting unit; 20: gate signal generating unit; 22: comparing unit; 24: one-shot pulse generating unit; 26: NOT circuit; 28: AND circuit; 30, 32, 34: RS flip-flop circuit; 40: target phase setting unit

The invention claimed is:
1. A static switch for switching between electrical connection and disconnection between an alternating-current power supply and a load, the static switch comprising:
a thyristor switch connected between the alternating-current power supply and the load and including a pair of arms connected in anti-parallel, each of the arms including a plurality of thyristors connected in series; and
a controller configured to perform on-off control of the thyristor switch,
the thyristor switch being configured to be turned on in response to a gate signal supplied from the controller, and turned off in response to a current coming to zero in a state in which the gate signal is interrupted, the controller including:
- a phase detecting unit configured to detect a phase of a power supply voltage supplied from the alternating-current power supply, and
- a gate signal generating unit configured to interrupt the gate signal when an open command is provided to the static switch and when the phase of the power supply voltage detected by the phase detecting unit matches a target phase, the target phase being set outside of a phase range where interruption of the gate signal is prohibited, the phase range being set so as to include a zero crossing point at which a load current is switched in polarity.

2. The static switch according to claim 1, wherein
the controller further includes a target phase setting unit configured to set the target phase, and
the target phase setting unit is configured to set the phase range where interruption of the gate signal is prohibited based on a power factor angle of the load, and set the target phase outside of the phase range.

3. The static switch according to claim 1, wherein an upper limit and a lower limit of the phase range where interruption of the gate signal is prohibited are set so as to satisfy a condition that all of the plurality of thyristors constituting each of the pair of arms have a conduction current larger than or equal to a holding current.

4. The static switch according to claim 2, wherein an upper limit and a lower limit of the phase range where interruption of the gate signal is prohibited are set so as to satisfy a condition that all of the plurality of thyristors constituting each of the pair of arms have a conduction current larger than or equal to a holding current.

* * * * *